United States Patent
Lai et al.

(10) Patent No.: US 9,219,219 B2
(45) Date of Patent: Dec. 22, 2015

(54) OSCILLATION STRUCTURE OF MICRO ACTUATOR

(71) Applicant: Opus Microsystems Corporation, Taipei (TW)

(72) Inventors: Yen-han Lai, Taipei (TW); Ta-wei Lin, Taipei (TW); Chang-li Hung, Taipei (TW)

(73) Assignee: OPUS MICROSYSTEMS CORPORATION, Taipei (TW)

( * ) Notice: Subject to any disclaimer, the term of this patent is extended or adjusted under 35 U.S.C. 154(b) by 390 days.

(21) Appl. No.: 13/952,101

(22) Filed: Jul. 26, 2013

(65) Prior Publication Data
US 2014/0028152 A1    Jan. 30, 2014

(30) Foreign Application Priority Data
Jul. 30, 2012  (TW) .............................. 101127510 A

(51) Int. Cl.
| | |
|---|---|
| *H01L 41/08* | (2006.01) |
| *G02B 26/08* | (2006.01) |
| *G02B 26/10* | (2006.01) |
| *B81B 3/00* | (2006.01) |

(52) U.S. Cl.
CPC .............. *H01L 41/08* (2013.01); *B81B 3/0045* (2013.01); *G02B 26/0833* (2013.01); *G02B 26/105* (2013.01); *B81B 2201/042* (2013.01)

(58) Field of Classification Search
CPC .... H01L 41/08; G02B 26/00; G02B 26/0858; G02B 26/0833; G02B 26/105
USPC ........................................... 310/320, 321, 328
See application file for complete search history.

(56) References Cited

U.S. PATENT DOCUMENTS

| | | |
|---|---|---|
| 2003/0209073 A1 | 11/2003 | Carroll et al. |
| 2005/0018322 A1 | 1/2005 | Ben-Gad et al. |
| 2007/0047046 A1 | 3/2007 | Ji |

FOREIGN PATENT DOCUMENTS

| | | |
|---|---|---|
| CN | 1920613 A | 2/2007 |
| JP | 07-27989 | 1/1995 |
| JP | 2003-207737 A | 7/2003 |
| KR | 10-2010-0126937 | 12/2010 |
| TW | 201128224 A1 | 8/2011 |
| WO | 2009-081858 A1 | 7/2009 |

*Primary Examiner* — Derek Rosenau
(74) *Attorney, Agent, or Firm* — Hauptman & Ham, LLP

(57) ABSTRACT

An oscillation structure of micro actuator is described. In the oscillation structure, a pair of torsion bars is disposed along a first axis perpendicular to a second axis. The first frame is connected to the pair of torsion bars wherein the torsion bars are disposed on the outer periphery of a first frame along the first axis and a second frame is disposed inside the first frame. Each of the first connection members connects the first frame to the second frame therebetween, and each of the second connection members connects the second frame to the oscillation body therebetween such that the first frame, the second frame and the oscillation body are allowed to rotate about the first axis by the torsion bars as a structure assemblies at an identical angle. The oscillation structure effectively reduces the dynamic deformation of micro actuator.

22 Claims, 9 Drawing Sheets

OSCILLATION STRUCTURE OF MICRO ACTUATOR

CROSS-REFERENCE TO RELATED APPLICATION

This application claims the priority of Taiwanese Patent Application No. 101127510 filed on Jul. 30, 2012 in the TIPO (Taiwan Intellectual Property Office), the disclosure of which incorporated herein in their entirety by reference.

FIELD OF THE INVENTION

The present invention relates to an oscillation structure, and more particularly relates to an oscillation structure of micro actuator to improve the dynamic deformation of the micro actuator undergoing torsional oscillation.

BACKGROUND OF THE INVENTION

Recently, Micro Electro Mechanical Systems (MEMS) devices are extensively used in motion sensing and actuating applications, such as accelerometers, gyroscopes, or micro scanning minors which are composed of a plurality of micro structures with a variety of design types, wherein the micro scanning minors are widely applicable to light reflection applications such as laser printing, image projection, head-mounted display and head-up display.

FIG. 1A is a schematic three-dimensional view of conventional torsional oscillation structure of micro actuator 100. The micro actuator 100 includes an oscillation body 102 and a pair of torsion bars 104 connected to the both sides of the oscillation body 102. A thin film is typically formed on the oscillation body 102 to increase the reflectivity of an incident light. The oscillation body 102 is connected to the supporting base (not shown) by way of the torsion bars 104. When a periodical torque applied to the actuator, the oscillation body 102 performs a reciprocal motion about the torsion bars 104 relative to the supporting base. If an incident light beam projects on the oscillation body 102, the reflected path of the incident light beam is changed according to the oscillation status of the oscillation body 102. A two-dimensional image may be formed by scanning incident light beam reflected by using two one-axial micro actuators or one two-axial micro actuator. However, the mass and the inertia of the oscillation body 102 exerted on the oscillation body 102 during the oscillation motion will cause deformation of the oscillation body 102 and resulting in a deformed reflective surface. If the peak to valley deformation measured on the reflective surface of the oscillation body 102 is too severe, for example exceeding one eighth of the wavelength of the incident light beam, the projected image quality will deteriorate due to divergence of the light beam after reflection. The peak to valley deformation of the oscillation body 102 is defined as dynamic deformation.

When the oscillation body 102 rotates about the axis Y by way of torsion bars 104, the dynamic deformation can be represented by the following equation (1):

$$\delta \propto \{[\rho^*(1-\upsilon^2)^*(2\pi f)^2 * \theta d^5 * \alpha]/[E^* t^2]\} \quad (1)$$

where the dynamic deformation "δ" is defined as the maximum dynamic deformation value of oscillation body 102 and is related to the following parameters: "ρ" defining the material density of the oscillation body 102, Poisson's ratio "υ" defining a ratio of transverse to axial strain of the oscillation body, "f" defining a vibration frequency of the oscillation body 102, "θ" defining the maximum oscillation angle of the oscillation body 102, "d" defining the length from the edge of the oscillation body 102 to the rotation axis 103, "α" defining circular shape coefficient of the oscillation body 102, "E" defining Young's modulus of the oscillation body 102, and "t" defining the thickness of the oscillation body 102.

FIG. 1B is a schematic view of the dynamic deformation in the oscillation structure of micro actuator 100 shown in FIG. 1A. When the torque 106 formed by the actuator exerts on the torsion bars 104, the oscillation body 102 rotates along the Y-axis and deforms due to its own mass and inertia. In FIG. 1B, line "CA" is a side view of profile if the oscillation body 102 rotates as an ideal rigid body about the Y-axis at an angle "θ", curve "CB" is a side view of the deformation profile when the oscillation body 102 rotates about the Y-axis at an angle "θ", and "δ" is defined as the maximum dynamic deformation value of oscillation body 102. The maximum dynamic deformation "δ" is proportional to the mass, oscillation frequency, oscillation angle and the length measured from the edge of the oscillation body 102 to the rotation axis, and is negatively proportional to the thickness of the oscillation body 102.

Referring to FIG. 1A, when the torque formed by the actuator 100 exerts on the torsion bars 104 or the oscillation body 102, the oscillation body 102 rotates until the oscillation body 102 reaches a maximum rotation angle, and the energy stored in the torsion bars 104 is in the form of elastic potential energy. The torque may be released or reversed in direction such that the elastic potential energy is converted into kinetic energy to drive the oscillation body 102 to form oscillation motion. The kinetic energy is transmitted through the torsion bars 104 and the first region RA1 of the oscillation body 102 and cause deformation in the first region RA1. Since the second region RA2 of the oscillation body 102 is distant from the rotational axis at a maximum distance, the dynamic deformation of the second region RA2 may be in a reverse direction due to the inertia of the oscillation body 102.

In FIG. 1C, a support frame 108 is disposed in the periphery of the oscillation body 102 for reducing the dynamic deformation of the oscillation body. However, because the connection part 110 which connects the frame 108 to the oscillation body 102 is in line with the torsion bars 104 along rotation axis 105, energy from the torsion bars 104 is directly transmitted to the oscillation body 102 through the torsion bars 104 and the connection part 110 such that the dynamic deformation of the oscillation body 102 cannot be efficiently reduced. Another technique of reducing dynamic deformation as shown in FIG. 1D, an additional support structure 112 with specific shape is disposed under the oscillation body 102 to reinforce the structure and further reduce the dynamic deformation. However, the additional structure complicates the micro actuator 100 manufacturing processes and may increase manufacturing difficulty and cost. Consequently, it would be desire to develop a novel oscillation structure of micro actuator to overcome the aforementioned disadvantages.

SUMMARY OF THE INVENTION

One objective of the present invention is to provide an oscillation structure of micro actuator to improve the dynamic deformation of micro actuator undergoing torsional motion.

According to the above objective, the present invention sets forth an oscillation structure of micro actuator. In one embodiment of the present invention, an oscillation structure includes a pair of torsion bars, a first frame, a second frame, an oscillation body, at least four first connection members and at least four second connection members. The pair of torsion bars is disposed in a first axis perpendicular to a second axis. The first frame coupled to the pair of torsion bars wherein the pair of torsion bars is disposed in an outer periphery of first frame along the first axis. The second frame is disposed inside the first frame. The oscillation body is disposed inside the second frame. The first connection members couple the first frame to the second frame therebetween, and the second connection members couple the second frame to the oscillation body such that the first frame, the second frame and the oscillation body rotate about the first axis defined by the pair of torsion bars. The first frame, the second frame and the oscillation body are arranged such that they have identical rotation angle about the first axis. When the elastic potential energy stored in the torsion bars is converted into the kinetic energy to drive the oscillation body, the energy is transmitted through the path, constructed by the first frame, the first connection members, the second frame and the second connection members to the oscillation body. Conversely, while the oscillation body converts the kinetic energy into elastic potential energy, the sequence is reverse. Therefore, the first frame and second frame are capable of distributing the energy transmitted from the outer regions of oscillation body near the first axis to the oscillation body by adjusting the energy transmission path to reduce the dynamic deformation of the oscillation structure.

According to the aforementioned descriptions, the present invention employs frame structures to reduce the dynamic deformation of micro actuator undergoing torsional motion.

BRIEF DESCRIPTION OF THE DRAWINGS

The included drawings are for illustrative purposes and serve only to provide examples of possible structures and arrangements for the disclosed inventive oscillation structure of micro actuator. These drawings in no way limit any changes in form and detail that may be made to the invention by one skilled in the art without departing from the spirit and scope of the invention.

DETAILED DESCRIPTION OF THE PREFERRED EMBODIMENTS

In the figures of the present invention, the same component numerals represent the same or similar components in different drawings.

The oscillation structure of micro actuator in the present invention includes at least two frames disposed in a periphery portion of the oscillation body. The frames and the oscillation body construct a plurality of inertia structure assemblies and the dynamic deformation of the oscillation body are reduced by arranging different widths of the frames which changes the inertia force characteristics applied to the oscillation body. Further, the inertia structure assemblies, e.g. the combination of a first frame, a second frame and the oscillation body, are capable of distributing energy transmitted from the torsion bars to the oscillation body 208 by adjusting the energy transmission path to reduce the dynamic deformation of the oscillation body. The various embodiments of the oscillation structures are described in detail below.

Figure 2A:
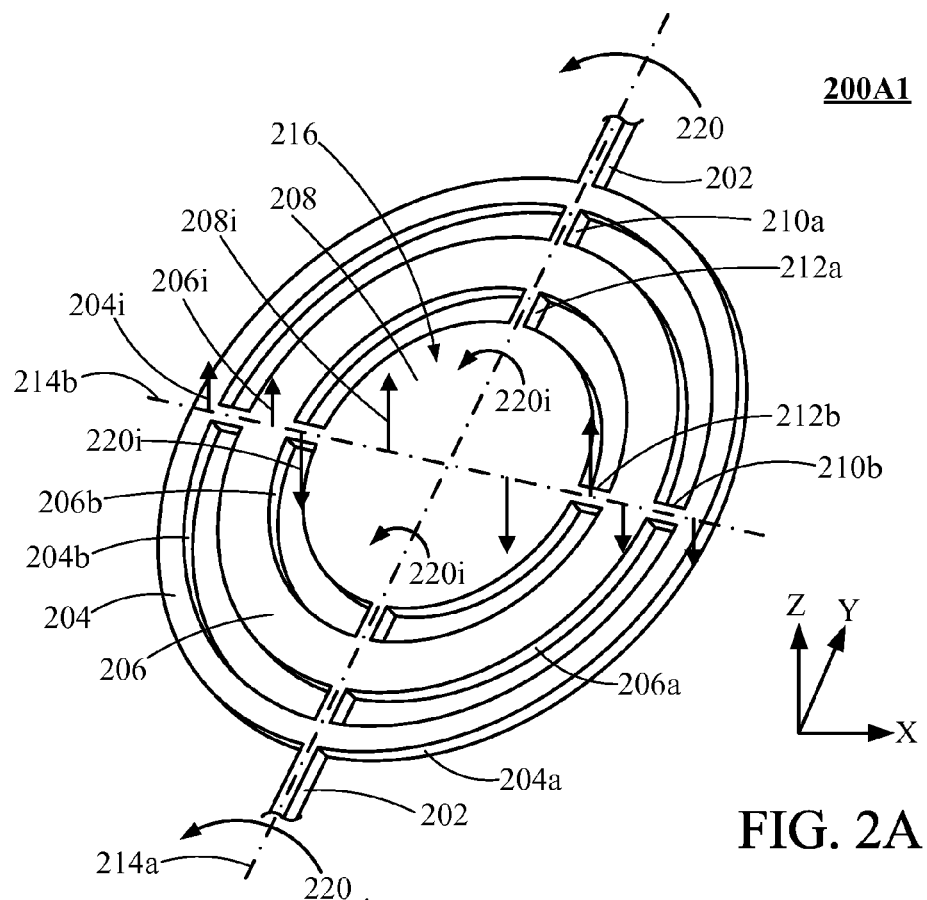
FIG. 2A is a schematic three-dimensional view of an oscillation structure having different frame widths according to a first embodiment of the present invention.
Figure 2B:
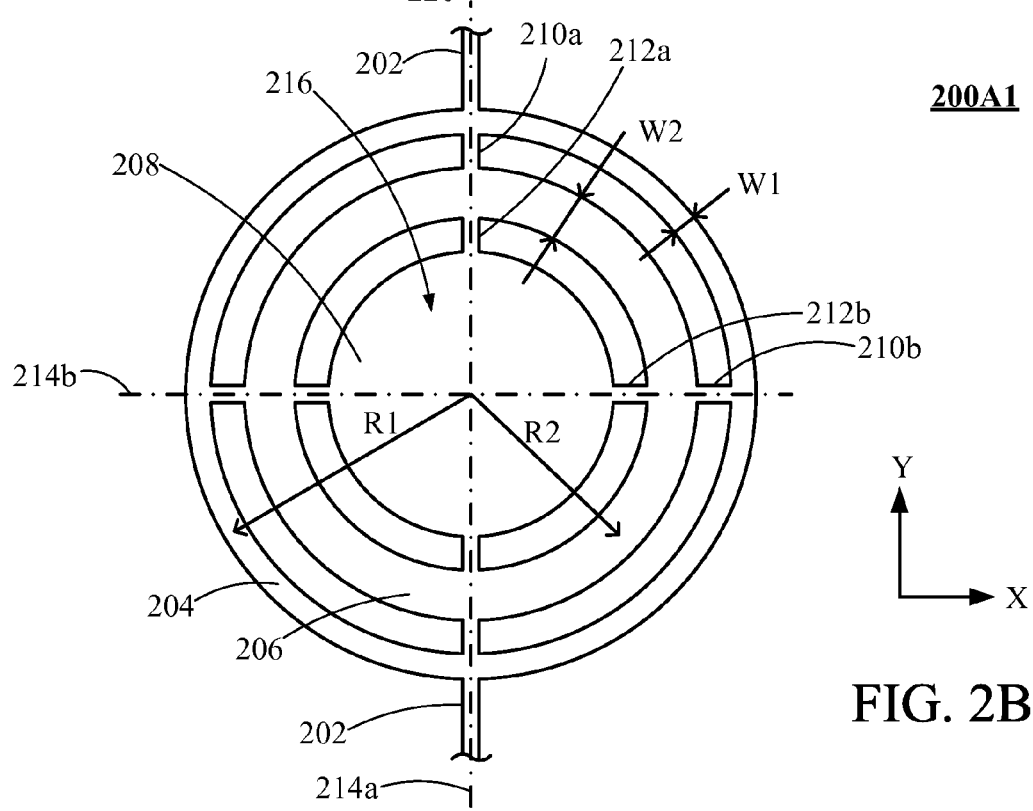
FIG. 2B is a schematic top view of the oscillation structure in FIG. 2A according to the first embodiment of the present invention.

Please refer to FIG. 2A and FIG. 2B. FIG. 2A is a schematic three-dimensional view of an oscillation structure 200A1 having different frame widths W1 and W2 according to a first embodiment of the present invention. FIG. 2B is a schematic top view of the oscillation structure 200A1 in FIG. 2A. The oscillation structure 200A1 applicable to a micro actuator includes a pair of torsion bars 202, a first frame 204, a second frame 206, an oscillation body 208, at least four first connection members 210a and 210b, and at least four second connection members 212a and 212b. As shown in FIG. 2A and FIG. 2B, the width W1 of the first frame 204 is less than the width W2 of the second frame 206.

The axial direction of a pair of torsion bars 202 defines a first axis 214a which is perpendicular to a second axis 214b. The first frame 204 is coupled to one end portion of each torsion bar 202 wherein the pair of torsion bars 202 is disposed in two opposite edges of the first outer periphery 204a of the first frame 204 along the first axis 214a. The second frame 206 is disposed inside the first inner periphery 204b of the first frame 204. The oscillation body 208 is disposed inside the second inner periphery 206b of the second frame 206, and includes a reflection surface 216 for reflecting the incident light beam (not shown). The four first connection members 210a, 210b respectively couple the first inner periphery 204b of the first frame 204 to the second outer periphery 206a of the second frame 206 therebetween, wherein one pair of the first connection members 210a of the first connection members 210a is aligned to the first axis 214a in a collinear manner, as shown in FIG. 2A and FIG. 2B. In one embodiment, another pair of the first connection members 210b of the first connection members 210b is aligned to the second axis 214b in the collinear manner, as shown in FIG. 2A and FIG. 2B. In another case, another pair of the first connection members 210b of the first connection members 210*b* is not aligned to the second axis 214*b* in a collinear manner. The four second connection members 212*a*, 212*b* respectively couple the second inner periphery 206*b* of the second frame 206 to the oscillation body 208 therebetween, wherein one pair of second connection members 212*a* of the second connection members 212*a* is aligned to the first axis 214*a* in a collinear manner, as shown in FIG. 2A and FIG. 2B. In one embodiment, another pair of second connection members 212*b* of the second connection members 212*b* is aligned to the second axis 214*b* in the collinear manner, as shown in FIG. 2A and FIG. 2B. Alternatively, another pair of second connection members 212*b* of the second connection members 212*b* is not aligned to the second axis 214*b* in a collinear manner.

Specifically, the first frame 204, the second frame 206 and the oscillation body 208 rotate about the first axis 214*a* by the pair of torsion bars 202. The first frame 204, the second frame 206 and the oscillation body 208 rotate as a structure assemblies due to the connection members at an identical angle about the first axis 214*a*. In other words, the first frame 204, the second frame 206 and the oscillation body 208 rotate about the first axis 214*a* in a coplanar manner. When the elastic potential energy stored in the torsion bars 202 is converted into the kinetic energy to drive the oscillation body 208 along the rotation direction 220 and induce the torque 220*i*, the energy is transmitted through the path, constructed by the first frame 204, the first connection member 210*a*, 210*b*, the second frame 206 and the second connection member 212*a*, 212*b*, to the oscillation body 208. In one embodiment of FIG. 2A and FIG. 2B, R1 the radius of gyration of the first frame 204 is greater than R2 the radius of gyration of the second frame 206 for effectively adjusting the inertia-effect-force 204*i*, 206*i* of the first frame 204 and second frame 206 and avoiding too much energy to be transmitted from the outer regions (of oscillation body 208) near the rotation axis to the oscillation body 208 to reduce the dynamic deformation of the oscillation body 208.

Figure 2C:
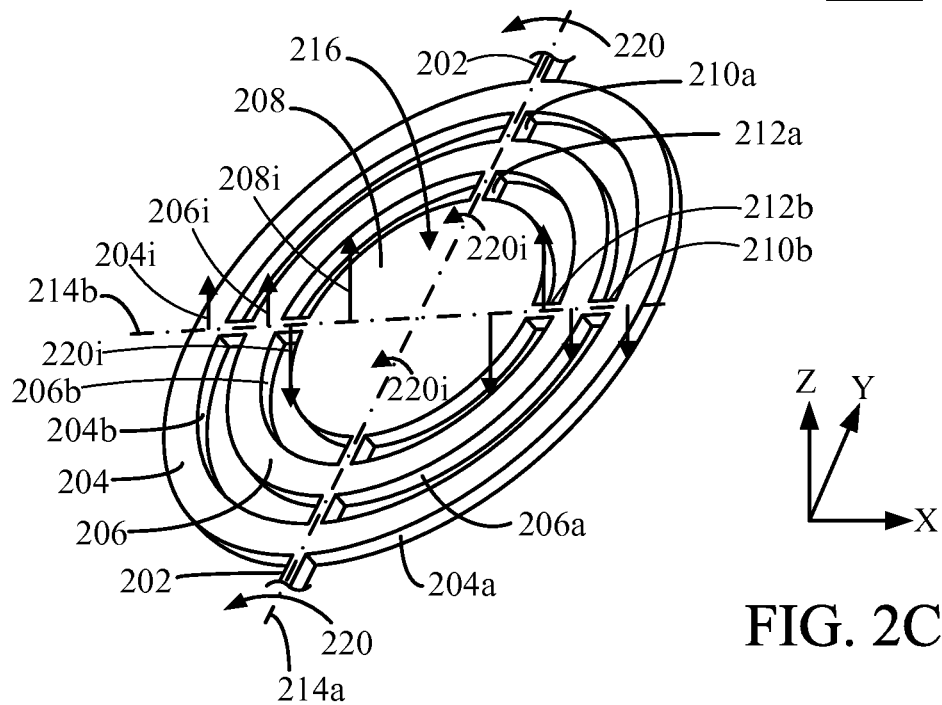
FIG. 2C is a schematic three-dimensional view of an oscillation structure having the same frame width according to a second embodiment of the present invention.
Figure 2D:
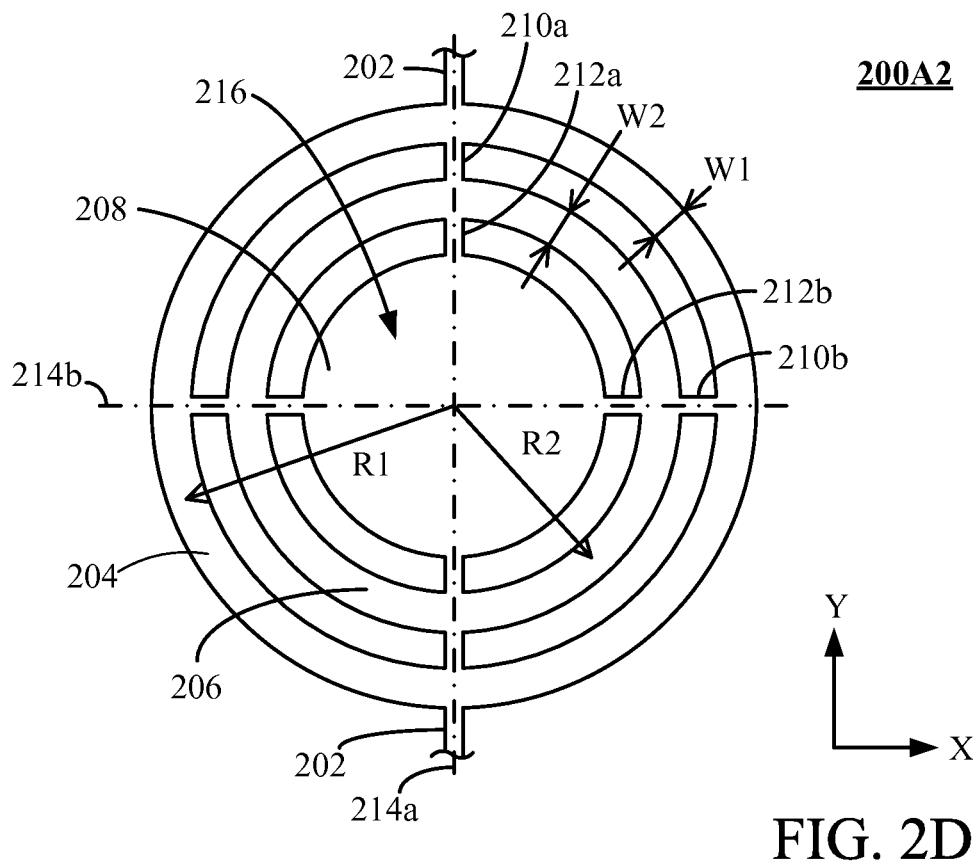
FIG. 2D is a schematic top view of the oscillation structure in FIG. 2C according to the second embodiment of the present invention.

Please refer to FIG. 2C and FIG. 2D. FIG. 2C is a schematic three-dimensional view of an oscillation structure 200A2 having the same frame width, W1 equal to W2 according to a second embodiment of the present invention. FIG. 2D is a schematic top view of the oscillation structure 200A2 in FIG. 2C. The oscillation structure 200A2 applicable to a micro actuator includes a pair of torsion bars 202, a first frame 204, a second frame 206, an oscillation body 208, at least four first connection members 210*a*, 210*b* and at least four second connection members 212*a*, 212*b*. In one case, four first connection members 210*a*, 210*b* and four second connection members 212*a*, 212*b* are depicted here, but not limited. As shown in FIG. 2C and FIG. 2D, the width W1 of the first frame 204 is equal to the width W2 of the second frame 206.

The axial direction of a pair of torsion bars 202 is disposed in a first axis 214*a* perpendicular to a second axis 214*b*. The first frame 204 is coupled to one end portion of each torsion bar 202 wherein the pair of torsion bars 202 is disposed in two opposite edges of the first outer periphery 204*a* of the first frame 204 along the first axis 214*a*. The second frame 206 is disposed inside the first inner periphery 204*b* of the first frame 204. The oscillation body 208 is disposed inside the second inner periphery 206*b* of the second frame 206 and includes a reflection surface 216 for reflecting the incident light beam (not shown). The four first connection members 210*a*, 210*b* respectively couple the first inner periphery 204*b* of the first frame 204 to the second outer periphery 206*a* of the second frame 206 therebetween, wherein one pair of first connection members 210*a* of the first connection members 210*a* is aligned to the first axis 214*a* in a collinear manner, as shown in FIG. 2C and FIG. 2D. In one embodiment, another pair of first connection members 210*b* of the first connection members 210*b* is aligned to the second axis 214*b* in the collinear manner, as shown in FIG. 2C and FIG. 2D. The four second connection members 212*a*, 212*b* respectively couple the second inner periphery 206*b* of the second frame 206 to the oscillation body 208 therebetween, wherein one pair of second connection members 212*a* of the second connection members 212*a* is aligned to the first axis 214*a* in a collinear manner, as shown in FIG. 2C and FIG. 2D. In one embodiment, another pair of second connection members 212*b* of the second connection members 212*b* is aligned to the second axis 214*b* in the collinear manner, as shown in FIG. 2C and FIG. 2D.

Figure 1A:
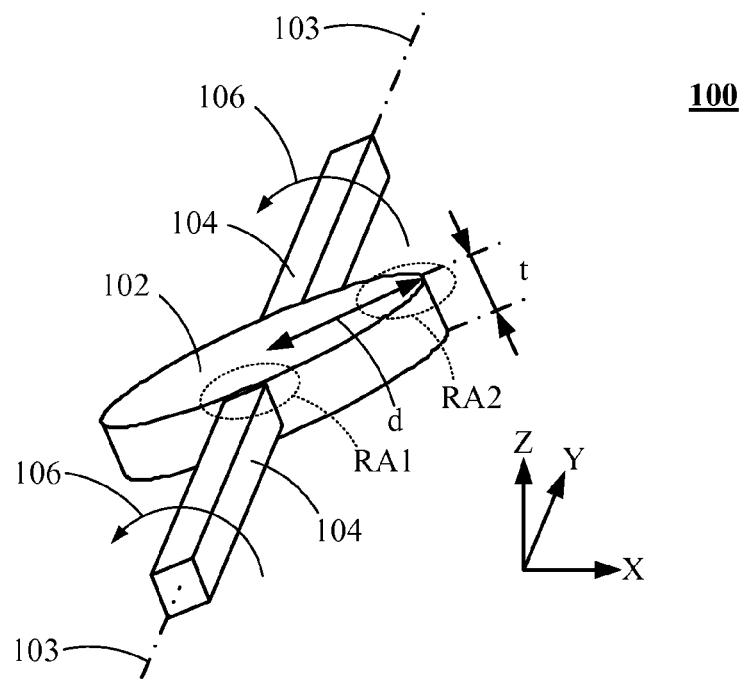
FIG. 1A is a schematic three-dimensional view of a first conventional oscillation structure of micro actuator.
Figure 1B:
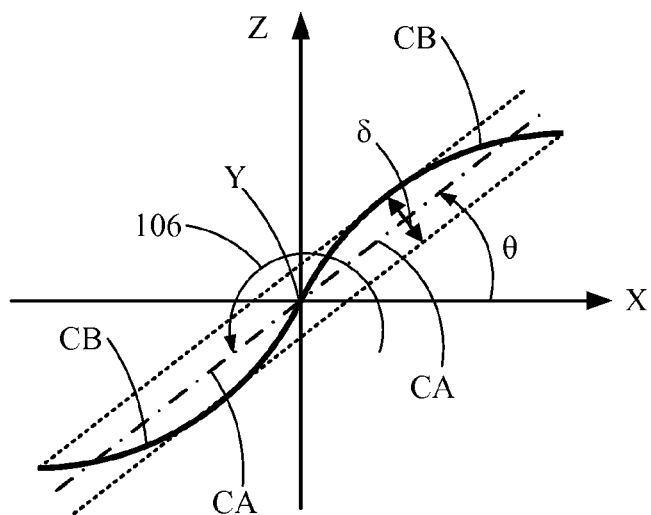
FIG. 1B is a schematic view of the dynamic deformation in the oscillation structure of micro actuator shown in FIG. 1A.
Figure 1C:
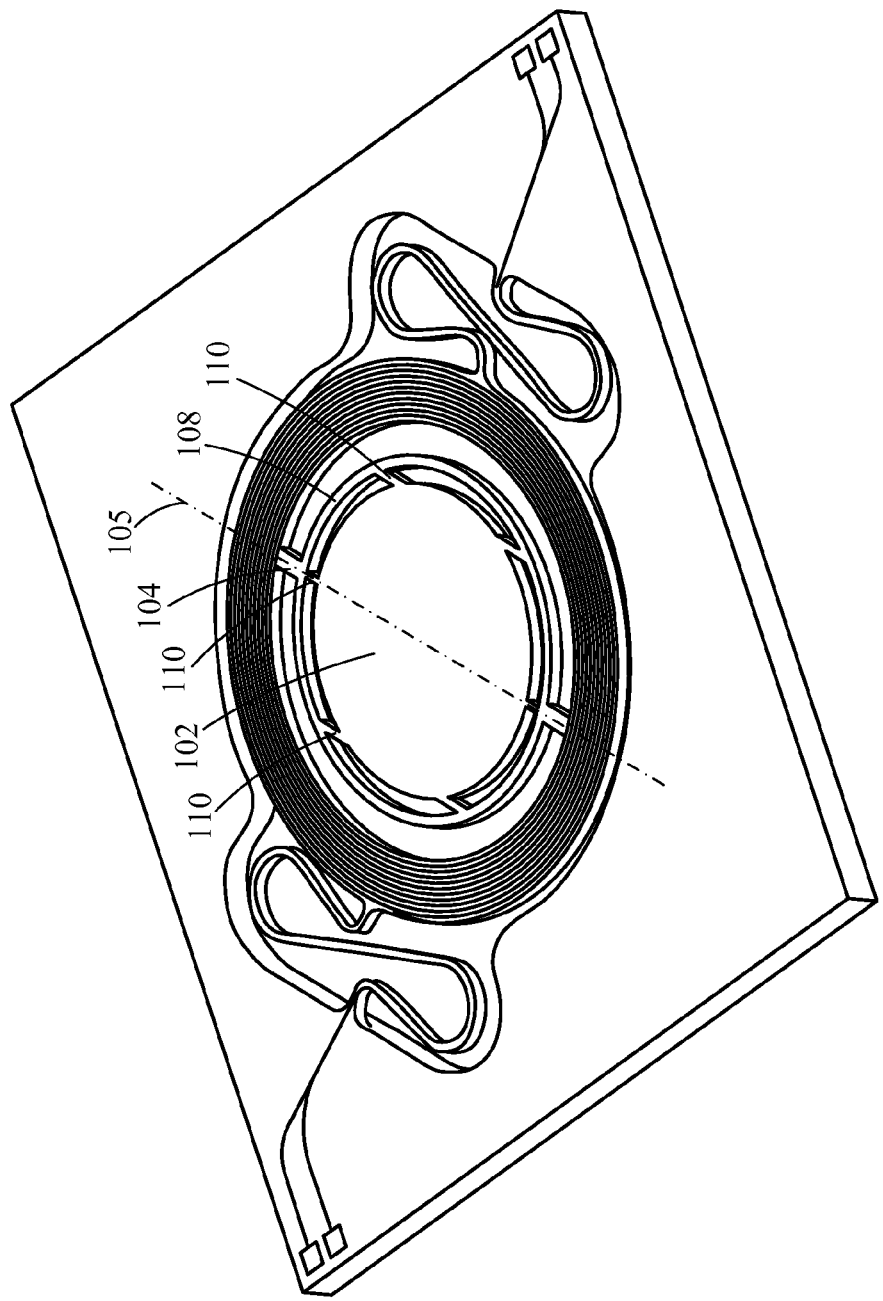
FIG. 1C is a schematic three-dimensional view of a second conventional oscillation structure of micro actuator.
Figure 1D:
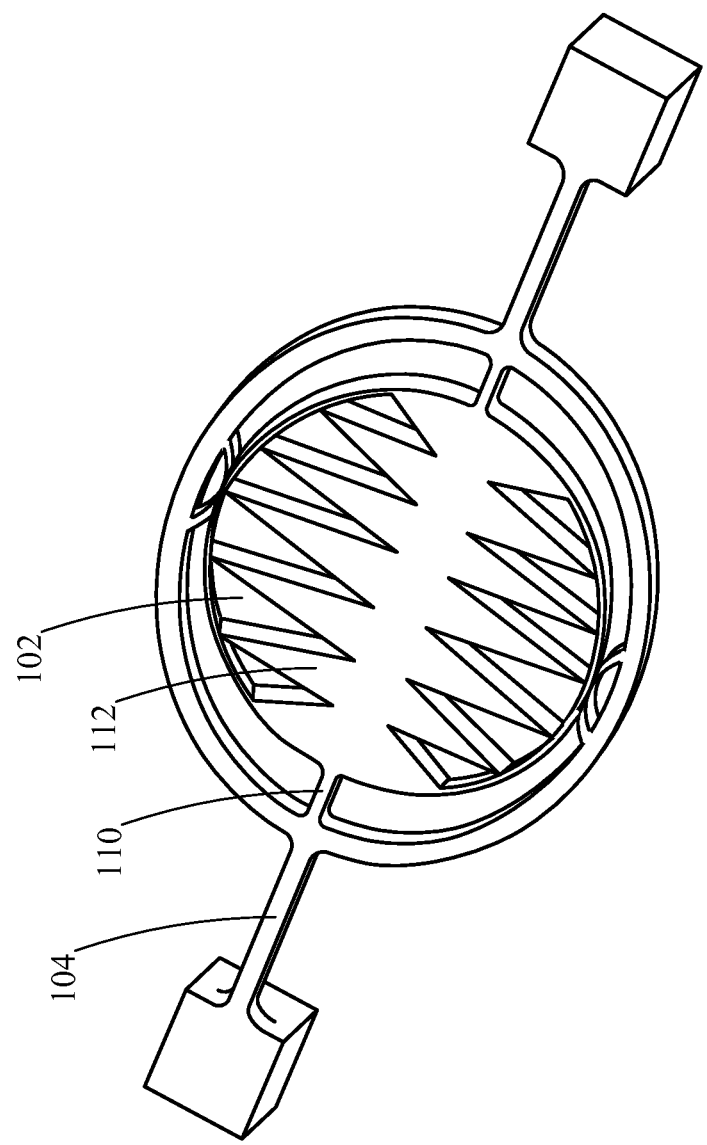
FIG. 1D is a schematic three-dimensional view of a third conventional oscillation structure of micro actuator.

Specifically, the first frame 204, the second frame 206 and the oscillation body 208 rotate about the first axis 214*a* by the pair of torsion bars 202. The first frame 204, the second frame 206 and the oscillation body 208 rotate as a structure assemblies due to the connection members at an identical angle about the first axis 214*a*. In other words, the first frame 204, the second frame 206 and the oscillation body 208 rotate about the first axis 214*a* in a coplanar manner. In comparison with conventional oscillation structure of FIG. 1C, the torsion bar 104 only utilizes a frame 108 directly connected to the oscillation body 102. However, the oscillation structure 200A2 of the present invention can improve the dynamic deformation. It should be noted that the first frame 204, the second frame 206 and the oscillation body 208 may be arbitrary geometry shape and the width W2 of the second frame 206 also can be either greater than or less than a width W1 of the first frame 204.

Figure 2E:
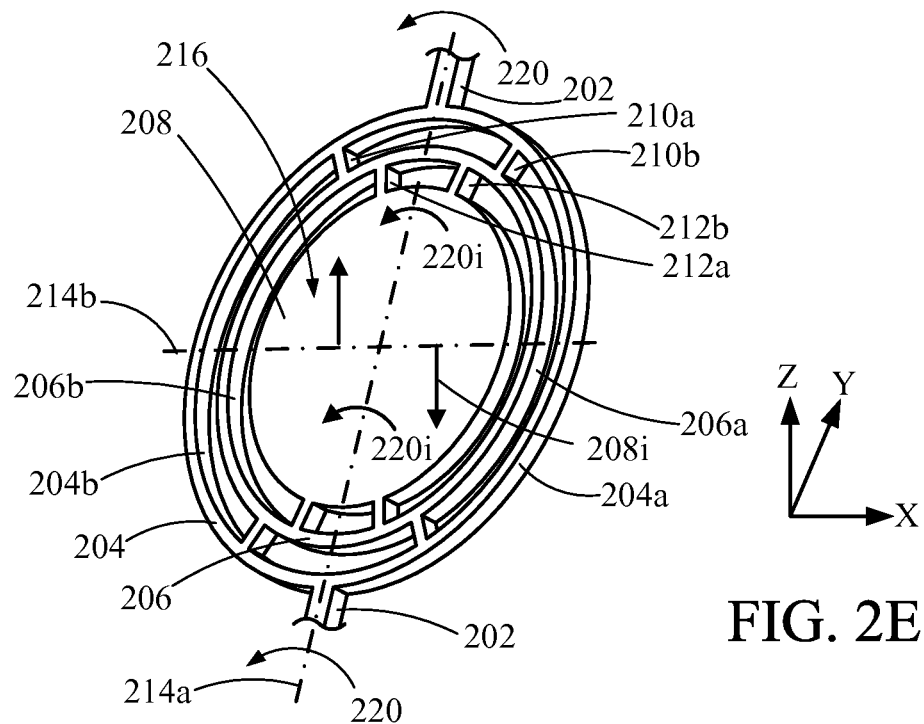
FIG. 2E is a schematic three-dimensional view of an oscillation structure having the same frame width according to a third embodiment of the present invention.
Figure 2F:
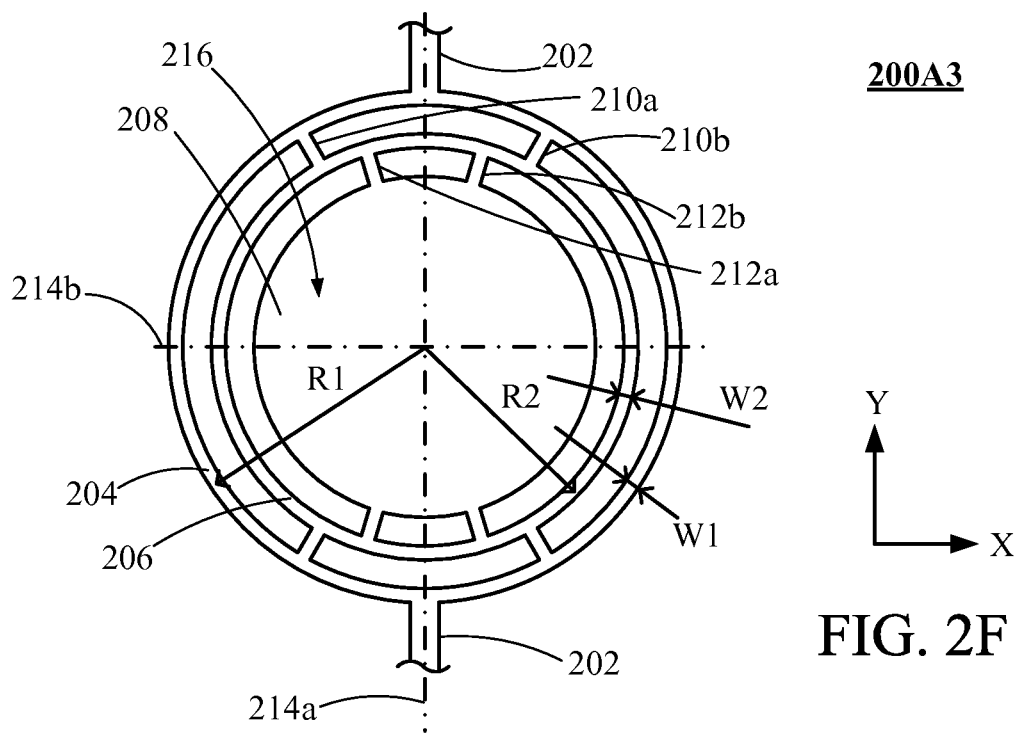
FIG. 2F is a schematic top view of the oscillation structure in FIG. 2E according to the third embodiment of the present invention.

Please refer to FIG. 2E and FIG. 2F. FIG. 2E is a schematic three-dimensional view of an oscillation structure 200A3 having the same frame width according to a third embodiment of the present invention. FIG. 2F is a schematic top view of the oscillation structure 200A3 in FIG. 2E according to the third embodiment of the present invention. The oscillation structure 200A3 applicable to a micro actuator includes a pair of torsion bars 202, a first frame 204, a second frame 206, an oscillation body 208, at least four first connection members 210*a*, 210*b* and at least four second connection members 212*a*, 212*b*. In one case, four first connection members 210*a*, 210*b* and four second connection members 212*a*, 212*b* are depicted here, but not limited. As shown in FIG. 2E and FIG. 2F, the width W1 of the first frame 204 is equal to the width W2 of the second frame 206.

The axial direction of a pair of torsion bars 202 is disposed in a first axis 214*a* perpendicular to a second axis 214*b*. The first frame 204 is coupled to one end portion of each torsion bar 202 wherein the pair of torsion bars 202 is disposed in two opposite edges of the first outer periphery 204*a* of the first frame 204 along the first axis 214*a*. The second frame 206 is disposed inside the first inner periphery 204*b* of the first frame 204. The oscillation body 208 is disposed inside the second inner periphery 206*b* of the second frame 206 and includes a reflection surface 216 for reflecting the incident light beam (not shown). The four first connection members 210*a*, 210*b* respectively couple the first inner periphery 204*b* of the first frame 204 to the second outer periphery 206*a* of the second frame 206 therebetween. In one embodiment, one pair of first connection members 210*a* of the first connection members 210*a* is not aligned to the first axis 214*a* and the second axis 214*b* in a collinear manner. Another pair of first connection members 210*b* of the first connection members 210*b* is not aligned to the first axis 214*a* and the second axis 214*b* in a collinear manner, as shown in FIG. 2E and FIG. 2F. The four second connection members 212*a*, 212*b* respectively couple the second inner periphery 206b of the second frame 206 to the oscillation body 208 therebetween. In one embodiment, one pair of second connection members 212a is not aligned to the first axis 214a and the second axis 214b in a collinear manner. Another pair of second connection members 212b is not aligned to the first axis 214a and the second axis 214b in a collinear manner, as shown in FIG. 2E and FIG. 2F.

Specifically, the first frame 204, the second frame 206 and the oscillation body 208 rotate about the first axis 214a by the pair of torsion bars 202. The first frame 204, the second frame 206 and the oscillation body 208 rotate as a structure assemblies due to the connection members at an identical angle about the first axis 214a. In other words, the first frame 204, the second frame 206 and the oscillation body 208 rotate about the first axis 214a in a coplanar manner. When the elastic potential energy stored in the torsion bars 202 is converted into the kinetic energy to drive the oscillation body 208 along the rotation direction 220 and induce the torque 220i, the energy is transmitted by way of the path, constructed by the first frame 204, the first connection member 210a, 210b, the second frame 206 and the second connection member 212a, 212b, to the oscillation body 208. In one embodiment of FIG. 2E and FIG. 2F, the first radius of gyration R1 of the first frame 204 is greater than the second radius of gyration R2 of the second frame 206 for effectively adjusting the inertia-effect-force 208i and avoiding too much energy to be transmitted from the outer regions (of oscillation body 208) near the rotation axis to the oscillation body 208 to reduce the dynamic deformation of the oscillation body 208. In FIG. 2E and FIG. 2F, the width W1 of the first frame 204 is equal to the width W2 of the second frame 206. In comparison with conventional oscillation structure of FIG. 1C, the torsion bar 104 only utilizes a frame 108 directly connected to the oscillation body 102. However, the present invention utilizes the oscillation structure 200A3 to improve the dynamic deformation. It should be noted that the first frame 204, the second frame 206 and the oscillation body 208 may be arbitrary geometry shape and the width W2 of the second frame 206 also can be either greater than or less than a width W1 of the first frame 204.

The oscillation structure 200A1, 200A2 of the present invention utilizes the first connection member 210b and the second connection member 212b for balancing the inertia-effect-forces 204i, 206i of the first frame 204 and second frame 206 to a portion of inertia-effect-force 208i of the oscillation body 208 and for adjusting the width W1 and the width W2 to reduce the dynamic deformation of the oscillation body 208. Moreover, the oscillation structure 200A3 of the present invention utilizes the first connection member 210a, 210b and the second connection member 212a, 212b for balancing the inertia-effect-forces 204i, 206i of the first frame 204 and second frame 206 to a portion of inertia-effect-force 208i of the oscillation body 208 and for adjusting the width W1 and the width W2 to reduce the dynamic deformation of the oscillation body 208.

Figure 3A:
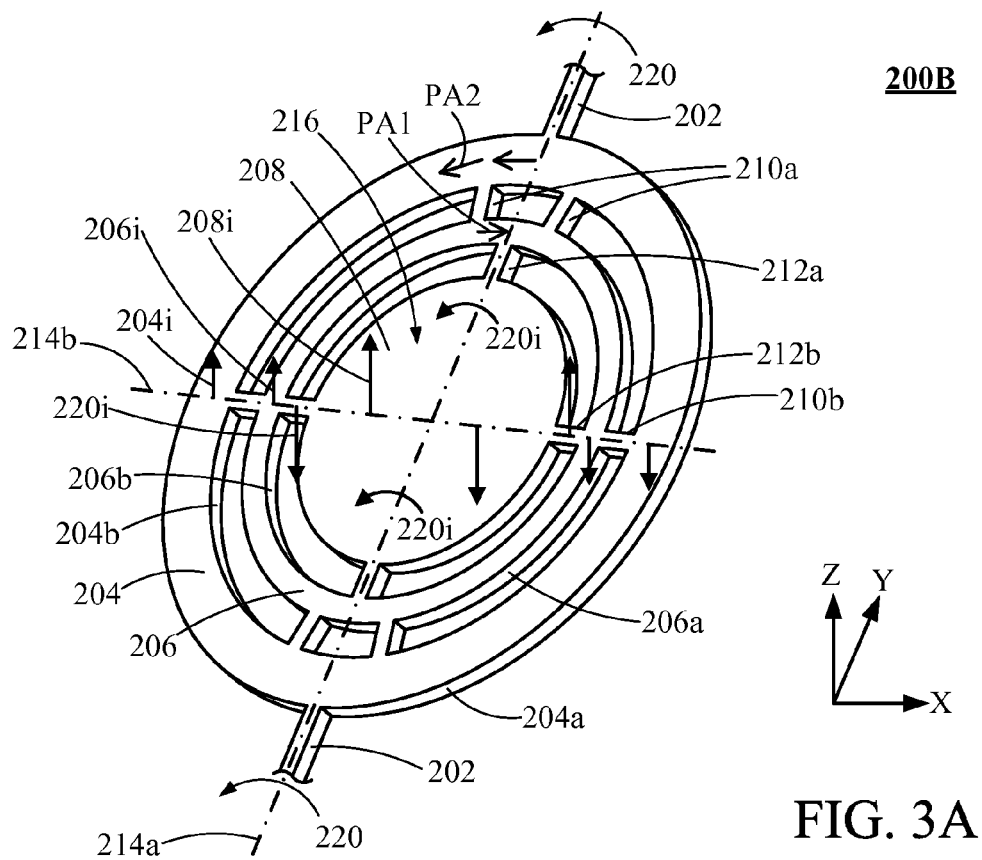
FIG. 3A is a schematic three-dimensional view of an oscillation structure according to a fourth embodiment of the present invention.
Figure 3B:
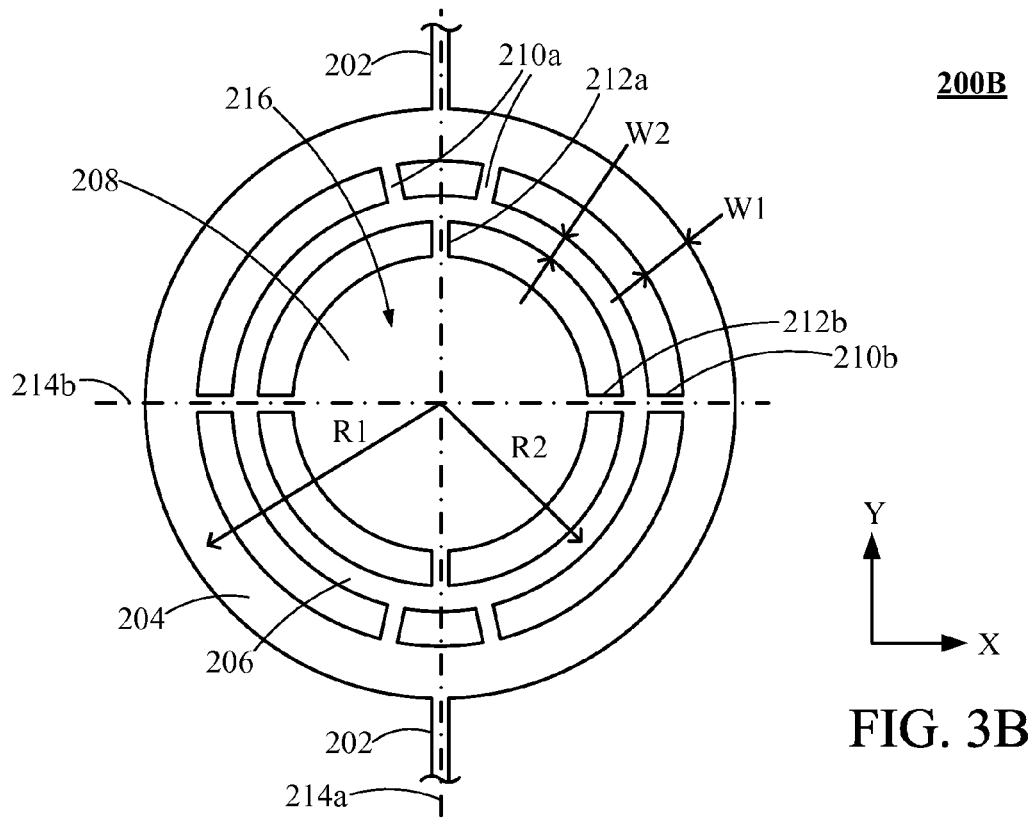
FIG. 3B is a schematic top view of the oscillation structure in FIG. 3A according to the fourth embodiment of the present invention.

Please refer to FIG. 3A and FIG. 3B. FIG. 3A is a schematic three-dimensional view of an oscillation structure 200B according to a fourth embodiment of the present invention. FIG. 3B is a schematic top view of the oscillation structure 200B in FIG. 3A according to the fourth embodiment of the present invention. The oscillation structure 200B applicable to a micro actuator includes a pair of torsion bars 202, a first frame 204, a second frame 206, an oscillation body 208, a plurality of first connection members 210a, 210b and a plurality of second connection members 212a, 212b. The first frame 204, the second frame 206 and the oscillation body 208 rotate about the first axis 214a by the pair of torsion bars 202.

The first frame 204, the second frame 206 and the oscillation body 208 rotate as a structure assemblies due to the connection members at an identical angle about the first axis 214a. In other words, the first frame 204, the second frame 206 and the oscillation body 208 rotate about the first axis 214a in a coplanar manner. In one embodiment, the six first connection members 210a, 210b form three pairs of first connection members 210a, 210b wherein two pairs of first connection members 210a is not aligned to the first axis 214a and the second axis 214b in a collinear manner. Another pair of first connection members 210b is aligned to the second axis 214b in a collinear manner. In one embodiment, four second connection members 212a, 212b forms two pairs of second connection members 212a, 212b and one pair of second connection members 212a is aligned to the first axis 214a in the collinear manner. Another pair of second connection members 212b is aligned to the second axis 214b in the collinear manner.

Such embodiment provides multiple paths for the elastic potential energy stored in the torsion bars 202 to be converted into the kinetic energy to drive the oscillation body 208 along the rotation direction 220 and induce the torque 220i. In FIG. 3A, the first path PA1 starts from the torsion bars 202, the first frame 204, the first connection member 210a, the second frame 206 and the second connection member 212a of the first axis 214a to the oscillation body 208, while the second path PA2 starts from the torsion bars 202, the first frame 204, the first connection member 210b of the second axis 214b, the second frame 206 and the second connection member 212b of the second axis 214b to the oscillation body 208. Since all forces exerted on the oscillation body 208 must be balanced, more energy is transmitted through path PA2. Specifically, there is a predetermined distance from the first connection member 210a to the torsion bar 202 and the second connection member 212a respectively and the width W2 of the second frame 206 is less than the width W1 of the first frame 204, therefore, the resistance of the energy transmission is increased. That is, in comparison with conventional oscillation structure of FIG. 1C, the oscillation structure 200B of the present invention blocks the energy from the oscillation body 208 by way of the first path PA1 and increases the amount of energy transmission by way of the second path PA2 to the oscillation body 208 for adjusting the torsional manner of the oscillation 208 by the torsion bars 202. The inertia-effect-forces 204i, 206i of the first frame 204 and second frame 206 are balanced by a portion of inertia-effect-force 208i of the oscillation body 208. In comparison with conventional oscillation structure of FIG. 1C, the oscillation structure 200B of the present invention can improve the dynamic deformation. It should be noted that the width W2 of the second frame 206 also can be either equal to or less than the width W1 of the first frame 204 in the oscillation structure 200B.

Figure 4A:
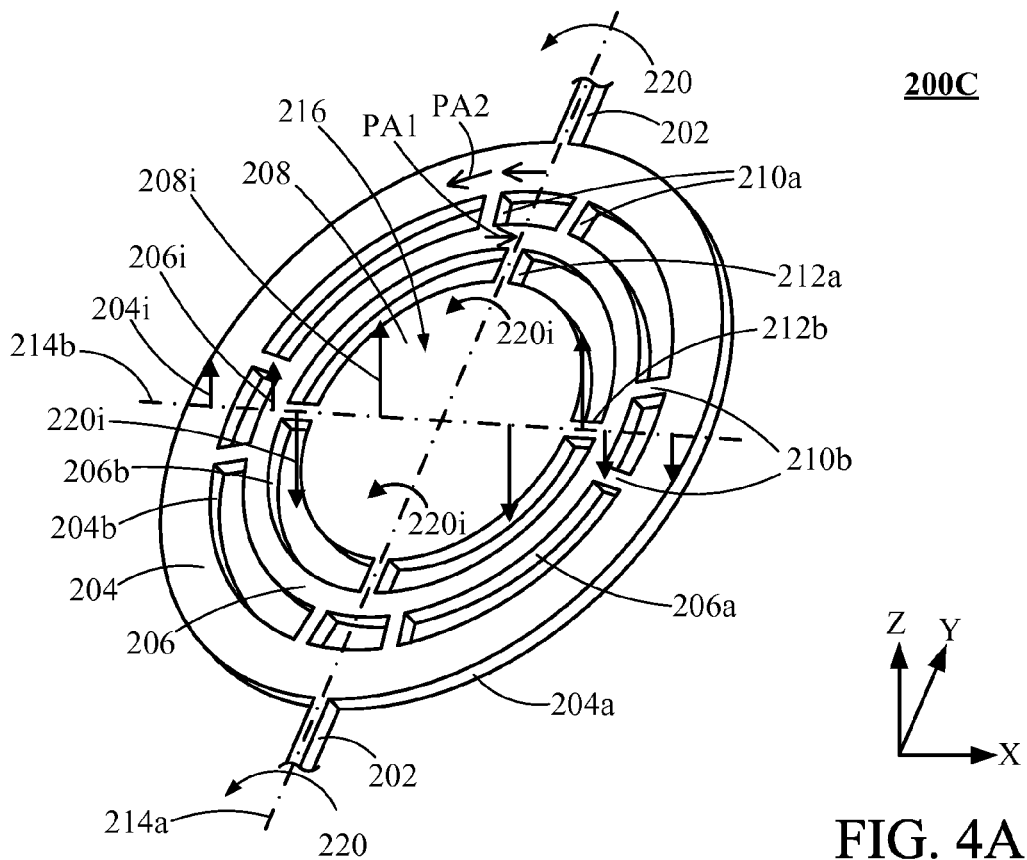
FIG. 4A is a schematic three-dimensional view of an oscillation structure according to a fifth embodiment of the present invention.
Figure 4B:
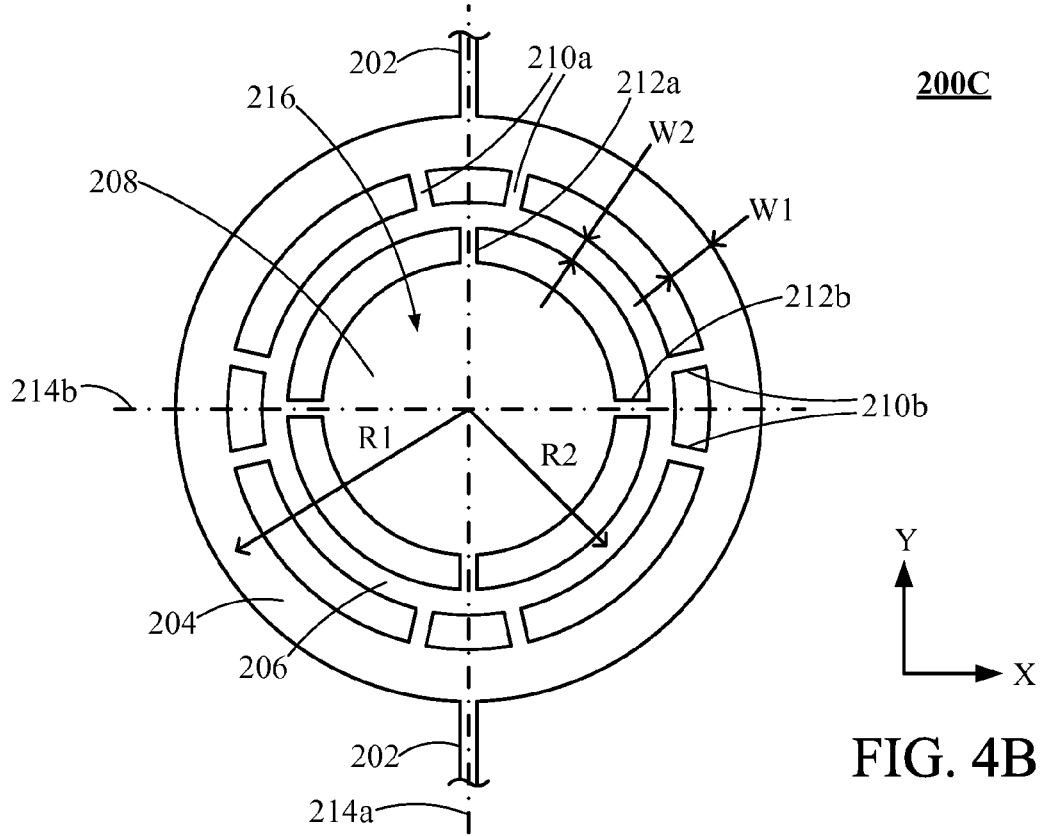
FIG. 4B is a schematic top view of the oscillation structure in FIG. 4A according to the fifth embodiment of the present invention.

Please refer to FIG. 4A and FIG. 4B. FIG. 4A is a schematic three-dimensional view of an oscillation structure 200C according to a fifth embodiment of the present invention. FIG. 4B is a schematic top view of the oscillation structure 200C in FIG. 4A according to the fifth embodiment of the present invention. The oscillation structure 200C applicable to a micro actuator includes a pair of torsion bars 202, a first frame 204, a second frame 206, an oscillation body 208, a plurality of first connection members 210a, 210b and a plurality of second connection members 212a, 212b. The first frame 204, the second frame 206 and the oscillation body 208 rotate about the first axis 214a by the pair of torsion bars 202. The first frame 204, the second frame 206 and the oscillation body 208 rotate as a structure assemblies due to the connection members at an identical angle about the first axis 214a. In other words, the first frame 204, the second frame 206 and the oscillation body 208 rotate about the first axis 214a in a coplanar manner. In one embodiment, the eight first connection members 210a, 210b form four pairs of first connection members 210a, 210b wherein four pairs of first connection members 210a, 210b is not aligned to the first axis 214a and the second axis 214b in a collinear manner. In one embodiment, four second connection members 212a, 212b forms two pairs of second connection members 212a, 212b and one pair of second connection members 212a is aligned to the first axis 214a in the collinear manner. Another pair of second connection members 212b is aligned to the second axis 214b in the collinear manner.

Such embodiment provides multiple paths for the elastic potential energy stored in the torsion bars 202 to be converted into the kinetic energy to drive the oscillation body 208 along the rotation direction 220 and induce the torque 220i. In FIG. 4A, the first path PA1 starts from the torsion bars 202, the first frame 204, the first connection member 210a, the second frame 206 and the second connection member 212a of the first axis 214a to the oscillation body 208, while the second path PA2 starts from the torsion bars 202, the first frame 204, the first connection member 210b near the second axis 214b (e.g. the both sides of the second axis 214b), the second frame 206 and the second connection member 212b of the second axis 214b to the oscillation body 208. Since all forces exerted on the oscillation body 208 must be balanced, more energy is transmitted through path PA2. In comparison with conventional oscillation structure of FIG. 1C, the oscillation structure 200C of the present invention can improve the dynamic deformation. It should be noted that the width W2 of the second frame 206 also can be either equal to or less than the width W1 of the first frame 204 in the oscillation structure 200C.

Figure 5:
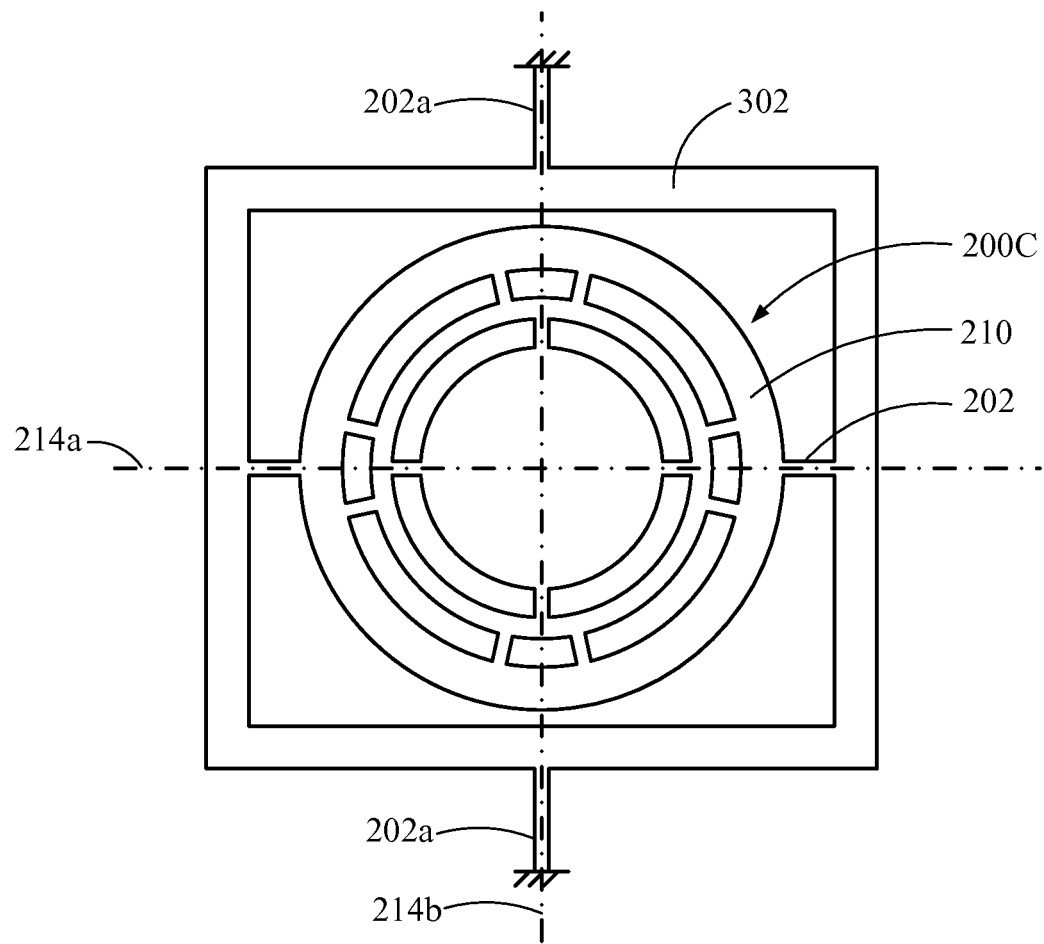
FIG. 5 is a schematic view of a two-dimensional oscillation structure of micro actuator having a gimbal frame according to one embodiment of the present invention.

FIG. 5 is a schematic view of a two-dimensional oscillation structure 300 of micro actuator having a gimbal frame 302 according to one embodiment of the present invention. The two-dimensional oscillation structure 300 includes the gimbal frame 302 and the oscillation structure 200C. The gimbal frame 302 is disposed in the periphery of the oscillation structure 200C wherein the pair of torsion bars 202 is connected to an inward edge of the gimbal frame 302 and the first frame 210. One end of torsion bars 202a are connected to an outward edge of the gimbal frame 302 and the other end of torsion bars 202a is stationary. In other words, the oscillation structure 200C rotates about the first axis 214a and the gimbal frame 302 rotates about the second axis 214b to form two-dimensional oscillation structure 300 in bi-axial rotation manner.

In the present invention, the oscillation structure utilizes a plurality of frames and connection members to reduce the dynamic deformation. The shapes and sizes of the frames and connection members can be properly adjusted, and also the arrangement of the connection members and the relative positions between frames and connection members can be specifically designed to minimize the dynamic deformation of the oscillation body. The thickness of torsion bars, frames, connection members, and the oscillation body can be identical to save the manufacturing cost.

According to the above-mentioned descriptions, the present inventions provide an oscillation structure of micro actuator to improve the dynamic deformation of micro actuator while the micro actuator is operated in a torsional motion.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. An oscillation structure applicable to a micro actuator, the oscillation structure comprising:
    a pair of torsion bars disposed in a first axis perpendicular to a second axis;
    a first frame coupled to the pair of torsion bars wherein the pair of torsion bars is disposed in an outer periphery of the first frame along the first axis;
    a second frame disposed inside the first frame;
    an oscillation body disposed inside the second frame;
    at least four first connection members coupling the first frame to the second frame therebetween, wherein a pair of the first connection members of the first connection members is aligned to the first axis in a collinear manner;
    at least four second connection members coupling the second frame to the oscillation body therebetween, wherein a pair of the second connection members of the second connection members is aligned to the first axis in a collinear manner to allow the first frame, the second frame and the oscillation body to rotate about the first axis by the pair of torsion bars.

2. The oscillation structure of claim 1, wherein the first frame, the second frame and the oscillation body connected by the first and the second connection members are allowed to rotate as a structure assemblies at an identical angle about the first axis.

3. The oscillation structure of claim 1, wherein the width of the first frame is either less than or equal to the width of the second frame.

4. The oscillation structure of claim 1, wherein another pair of the first connection members of the first connection members is aligned to the second axis in a collinear manner.

5. The oscillation structure of claim 1, wherein another pair of the first connection members of the first connection members is not aligned to the second axis in a collinear manner.

6. The oscillation structure of claim 1, wherein another pair of the second connection members of the second connection members is aligned to the second axis in a collinear manner.

7. The oscillation structure of claim 1, wherein another pair of the second connection members of the second connection members is not aligned to the second axis in a collinear manner.

8. The oscillation structure of claim 1, further comprising a gimbal frame, wherein an inward edge of the gimbal frame is connected to the pair of torsion bars.

9. The oscillation structure of claim 8, wherein an outward edge of the gimbal frame is connected to a second pair of torsion bars along the second axis to allow the gimbal frame to rotate about the second axis by the second pair of torsion bars.

10. An oscillation structure applicable to a micro actuator, the oscillation structure comprising:
    a pair of torsion bars disposed in a first axis perpendicular to a second axis;
    a first frame coupled to the pair of torsion bars wherein the pair of torsion bars is disposed in an outer periphery of the first frame along the first axis;
    a second frame disposed inside the first frame;
    an oscillation body disposed inside the second frame;
    at least four first connection members coupling the first frame to the second frame therebetween;
    at least four second connection members coupling the second frame to the oscillation body therebetween, wherein the first frame, the second frame and the oscillation body rotate about the first axis by the pair of torsion bars.

11. The oscillation structure of claim 10, wherein the first frame, the second frame and the oscillation body connected by the first and the second connection members are allowed to rotate as a structure assemblies at an identical rotation angle about the first axis.

12. The oscillation structure of claim 10, wherein the width of the second frame is either less than or equal to the width of the first frame.

13. The oscillation structure of claim 10, wherein at least one pair of the first connection members is aligned to the first axis in a collinear manner.

14. The oscillation structure of claim 10, wherein at least one pair of the first connection members is aligned to the second axis in a collinear manner.

15. The oscillation structure of claim 10, wherein at least one pair of the second connection members is aligned to the first axis in a collinear manner.

16. The oscillation structure of claim 15, wherein another pair of second connection members of the second connection members is aligned to the second axis in a collinear manner.

17. The oscillation structure of claim 10, wherein at least one pair of the first connection members is not aligned to the first axis and the second axis in a collinear manner.

18. The oscillation structure of claim 17, wherein another pair of the first connection members is not aligned to the first axis and the second axis in a collinear manner.

19. The oscillation structure of claim 10, wherein at least one pair of the second connection members is not aligned to the first axis and the second axis in a collinear manner.

20. The oscillation structure of claim 19, wherein another pair of the second connection members is not aligned to the first axis and the second axis in a collinear manner.

21. The oscillation structure of claim 10, further comprising a gimbal frame, wherein an inward edge of the gimbal frame is connected to the pair of torsion bars.

22. The oscillation structure of claim 21, wherein an outward edge of the gimbal frame is connected to a second pair of torsion bars along the second axis to allow the gimbal frame to rotate about the second axis by the second pair of torsion bars.

* * * * *